United States Patent [19]

Ikawa et al.

[11] Patent Number: 5,239,509
[45] Date of Patent: Aug. 24, 1993

[54] SEMICONDUCTOR MEMORY DEVICE

[75] Inventors: Tatsuo Ikawa, Kawasaki; Shigeo Ohshima, Yokohama, both of Japan

[73] Assignee: Kabushiki Kaisha Toshiba, Kawasaki, Japan

[21] Appl. No.: 824,356

[22] Filed: Jan. 23, 1992

[30] Foreign Application Priority Data

Jan. 23, 1991 [JP] Japan .................................. 3-6427

[51] Int. Cl.⁵ ......................... G11C 13/00; G11C 7/00
[52] U.S. Cl. ................................ 365/201; 365/230.05; 365/230.09; 365/230.01; 371/21.1; 371/40.1
[58] Field of Search ............... 365/201, 230.05, 230.09; 371/5.1, 37.7, 40.3, 51.1, 40.1, 21.1

[56] References Cited

U.S. PATENT DOCUMENTS 5,079,747  1/1992  Nakada ............................. 365/201
5,097,447  3/1992  Ogawa et al. ..................... 365/200

FOREIGN PATENT DOCUMENTS 62-277700  12/1987  Japan .

Primary Examiner—Eugene R. LaRoche
Assistant Examiner—Viet Q. Nguyen
Attorney, Agent, or Firm—Foley & Lardner

[57] ABSTRACT

A semiconductor memory device having: a RAM port for randomly accessing a memory cell array having memory cells disposed in matrix; a SAM port for serially accessing data of one row of the memory cell array; a mode switching unit for switching the operation mode of the SAM port between an ordinary data output mode and a test mode, upon externally receiving a mode switching signal; and an address pointer outputting unit for outputting an address pointer of the SAM port when the operation mode is switched to the test mode by the mode switching unit.

3 Claims, 2 Drawing Sheets

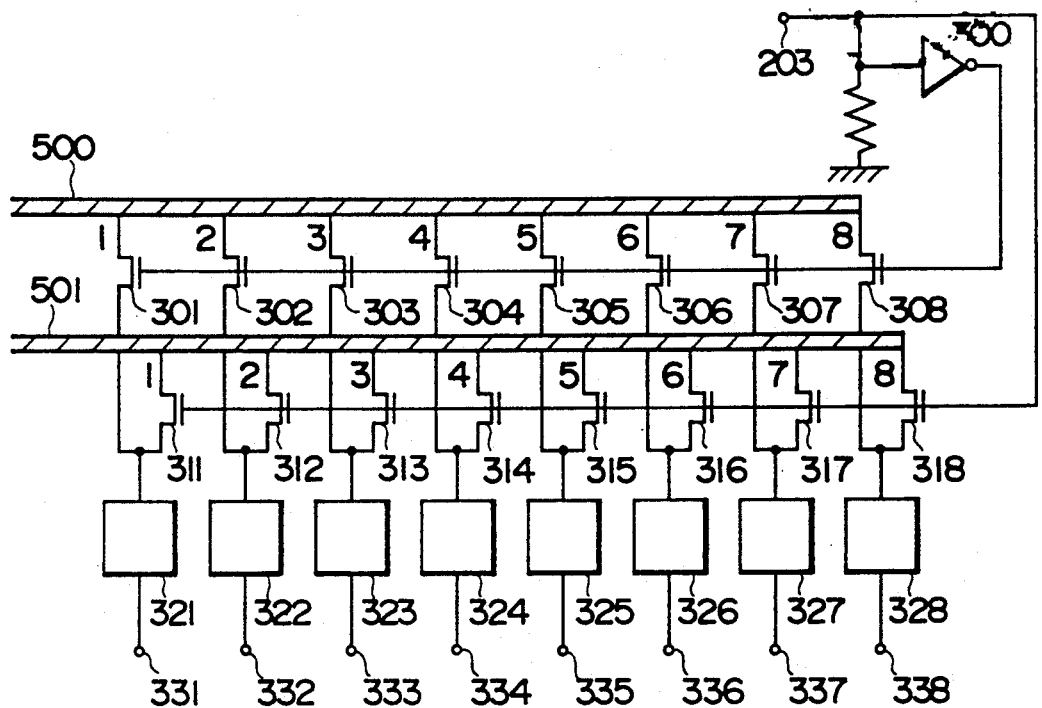
F I G. 2
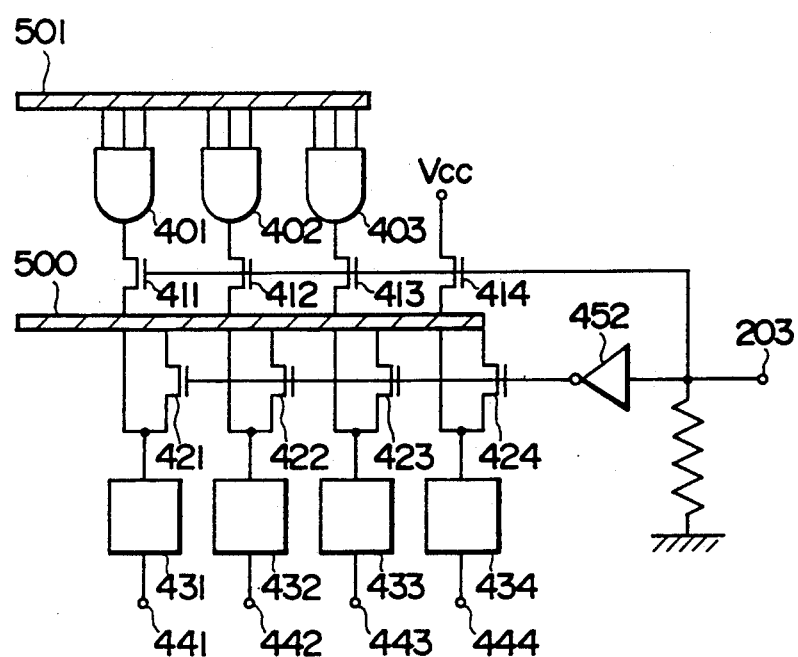
F I G. 3

SEMICONDUCTOR MEMORY DEVICE

BACKGROUND OF THE INVENTION

The present invention relates to a semiconductor memory device, and more particularly to a multi-port semiconductor memory device having a RAM port for randomly accessing memory cells and a SAM port for serially accessing memory cells.

In recent semiconductor memory devices, together with increasing memory capacity, there is a trend toward multifunctionalization wherein the functions of parts of peripheral circuits are incorporated therein. Mass production of one type of devices is therefore changing to small production of various types of devices. Man power resources are not expanded easily, so the period of development is required to be shortened.

As an example of a semiconductor memory device developed as having a multi-function, there is a multi-port semiconductor memory device having a RAM port for randomly accessing memory cells and a SAM port for serially accessing data in units of the row. This device has a register for storing one row data for serial access and means for data transfer between the register and memory cells.

In general, the RAM port operates asynchronously with the SAM port. The data transferring means transfers data between the register and memory cells, stopping the operation of the SAM port. During the data transfer; cycle, an address pointer to the start address for read/write of the SAM port is obtained at the timing when a row address signal is received.

The SAM port selects the register using a serial counter in the memory device. Therefore, if data outputted from the SAM port is erroneous, it is difficult to discriminate between a fault in obtaining the address pointer and a fault in the data itself.

SUMMARY OF THE INVENTION

It is therefore an object of the present invention to provide a semiconductor memory device having a function to check the cause of a fault of data read from a SAM port, easily and reliably.

The present invention provides a semiconductor memory device of a multi-port structure having a RAM port for randomly accessing a memory cell array having memory cells disposed in matrix and a SAM port for serially accessing data of one row of the array, comprising mode switching means for switching the operation mode of the SAM port between an ordinary data output mode and a test mode, upon externally receiving a mode switching signal; and address pointer outputting means for outputting an address pointer of the SAM port when the operation mode is switched to the test mode by said mode switching means.

When a mode select signal is supplied to the mode switching means, the operation mode is changed to the test mode, and the address pointer of the SAM port is outputted by the address pointer outputting means. Therefore, when data outputted from the SAM port is erroneous, it is possible to easily discriminate between a fault in the data itself and a fault in obtaining the address pointer.

If the address pointer outputting means includes an output buffer circuit which is the same output buffer circuit for outputting data from the SAM port, the same output buffer circuit is used in common for both purposes, reducing the size of the memory device.

If the output buffer circuit is used in common and the bit configuration of the SAM port is smaller than the number of bits of the address pointer, the number of output terminals is insufficient for outputting the address pointer at a time. However, the address pointer can be monitored indirectly by outputting the logical sum of at least two parts obtained by dividing the address pointer.

BRIEF DESCRIPTION OF THE DRAWINGS

FIG. 2 is a circuit diagram showing the structure of a circuit portion of the device shown in FIG. 1 for executing a mode change.

FIG. 3 is a circuit diagram showing another structure of the circuit portion of the device shown in FIG. 1 for executing the mode change.

DESCRIPTION OF THE PREFERRED EMBODIMENT

Figure 1:
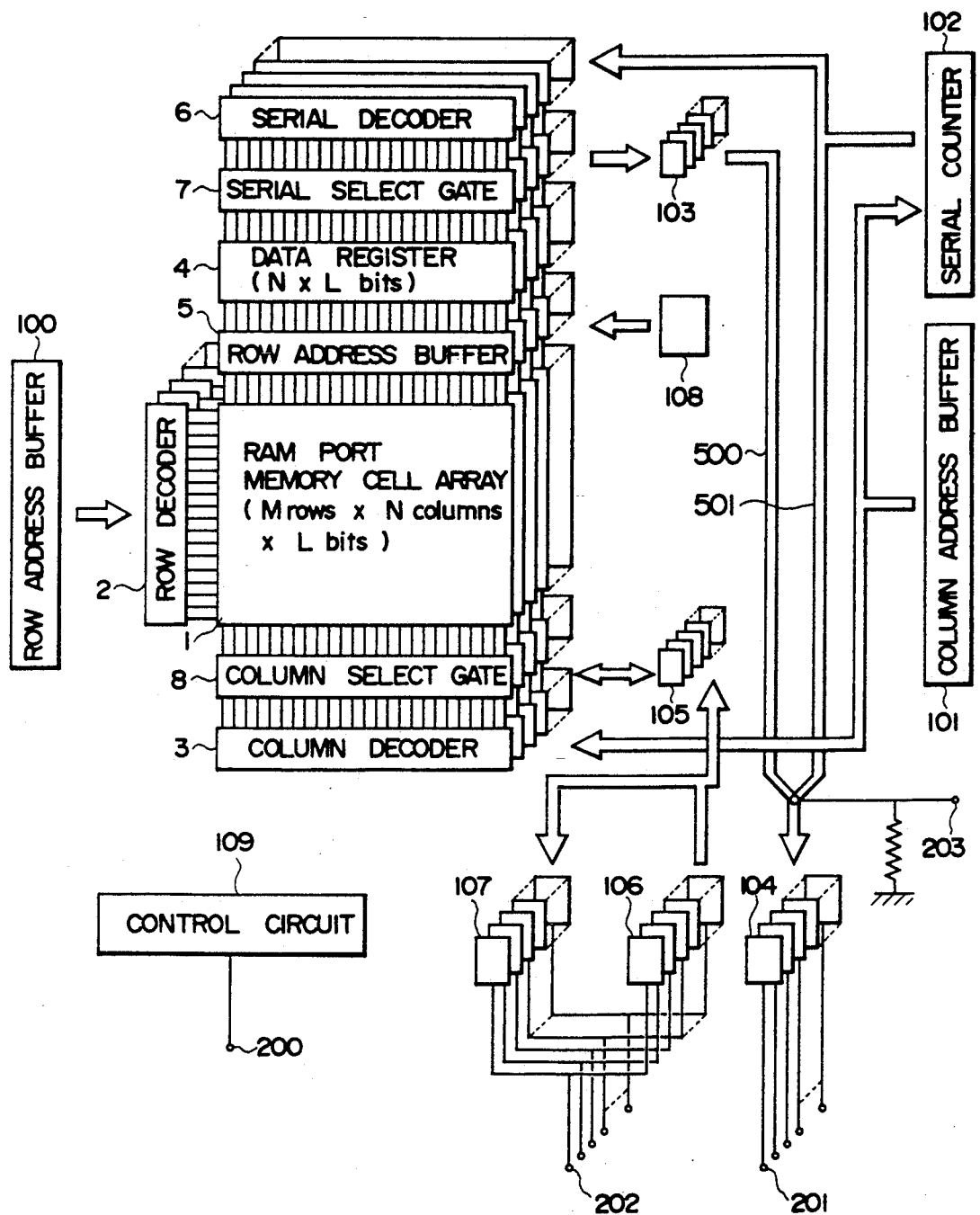
FIG. 1 is a circuit diagram showing the structure of a semiconductor memory device according to an embodiment of the present invention.

An embodiment of the present invention will be described with reference to the accompanying drawings. FIG. 1 shows the structure of a semiconductor memory device of the embodiment. Provided as a RAM port is a memory cell array 1 having memory cells of M rows×N columns×L bits.

As a means for randomly accessing the memory cell, a row decoder 2 and column decoder 3 are provided. Random access is executed using the accessing means in the following manner.

A central processing unit (CPU) not shown in FIG. 1 outputs a row address signal and a column address signal. The row address signal is amplified by a row address buffer 100 and decoded by the row decoder 2 to select one of the rows. The column address signal is amplified by a column address buffer 101 and decoded by the column decoder 3 to open the column select gate 8 of one of the columns. In this manner, one particular row and one particular column are selected to thereby access one memory cell.

In writing data in a selected memory cell, the data applied to a RAM port output pad 202 is supplied to a data buffer 105 via a data input buffer 106 and written in the memory cell via a column line selected by the column select gate. In reading data from a selected memory cell, the data sensed from the cell is outputted via the data buffer 105, data output buffer 107 and RAM port output pad 202, to an external circuit.

Provided for the columns of the memory cell array 1 are a data register 4 of N×L bits and a data transfer gate used for transfer data from the memory cell array 1 to the data register 4. Provided as a serial accessing means for N data are a serial counter 102, serial decoder 6 and serial select gate 7.

The serial counter 102 is supplied with an output of the column address buffer 101 during the preceding data transfer cycle, the address pointer being initialized beforehand. When a serial control signal SC externally inputted to the input terminal 200 of a control circuit 109 rises, the count of the serial counter 102 is incremented by 1, incrementing the address pointer by 1. This address pointer is supplied to the serial decoder 6 to decode it. The decoded address pointer is outputted to the serial select gate 7. The data register corresponding to the decoded address pointer is connected to a serial digit line extending in the lateral direction within the serial select gates 7. As the address pointer is incremented sequentially by the serial counter 102, the data registers starting from the lower bit are sequentially connected to the serial digit line by the serial select gates 7. In this manner, data stored in the data registers 4 is serially outputted from the serial select gates 7. The data is then amplified by a serial data buffer 103, and outputted via a serial output buffer 104 and SAM output port pad 201 to an external circuit. In parallel with the above operation, the data read during the preceding cycle is outputted from the serial data output buffer 104 to the external circuit.

Data transfer between the RAM port and SAM port is carried out using a data transfer gate 5. When a transfer control signal is received from a data transfer control circuit 108, the data transfer gate 5 opens to allow the data to be transferred between memory cells of a selected row in the array 1 and the data register 4. A row is selected using the row address buffer 100 and row decoder 2 as described previously.

In this embodiment, as a means for externally outputting the address pointer, there are additionally provided a test mode select pad 203 and a serial address pointer line 501 interconnecting the serial counter 102 and the serial data output buffer 104. With such an arrangement, when data outputted from the SAM port is erroneous, it is possible to discriminate between a fault in the data itself and a fault in obtaining the address pointer.

In a normal mode, the serial data output buffer 104 is connected to the serial data line 500 to output the data read from the data register during the preceding cycle. When a signal of a power supply potential is inputted to the test mode select pad 203, the operation mode is switched to a test mode. During this test mode, the serial data output buffer 104 is connected to the serial address pointer line 501 to output the address pointer from the serial counter 102.

FIG. 2 shows the structure of a circuit for switching the serial data output buffer 104 from the serial data line 500 to the serial address pointer line 501 upon input of a signal to the test mode select pad 203.

Connected to the serial data line 500 are the drains of N-channel MOS transistors 301 to 308 the sources of which are connected to serial data output buffers 321 to 328. Each gate is connected via an inverter 300 to the test mode select pad 203. Connected to the serial address pointer line 501 are the drains of N-channel MOS transistors 311 to 318, the gates of which are connected to the test mode select pad 203, and the sources of which are connected to the serial data output buffers 321 to 328. The serial data output buffers 321 to 328 are provided with SAM port output pads 331 to 338, respectively.

In the normal mode, a low level signal is applied to the test mode select pad 203 and to the gates of the N-channel MOS transistors 311 to 318 to turn them off, so that the serial address pointer line 501 is electrically isolated from the serial data output buffers 321 to 328. On the other hand, a high level signal inverted by the inverter 300 is applied to the gates of the N-channel MOS transistors 301 to 308, so that the serial data line 500 is connected to the serial data output buffers 321 to 328. In this manner, data read from the data register 4 is outputted from the SAM port output pads 331 to 338.

In the test mode, a signal of a power supply potential is applied to the test mode select pad 203, so that the N-channel MOS transistors 311 to 318 turn on to connect the serial address pointer line 501 to the serial data output buffers 321 to 328. Therefore, the N-channel MOS transistors 301 to 308 turn off to disconnect the serial data line 500 from the serial data output buffers 321 to 328. As a result, an address pointer is outputted from the SAM port output pads 331 to 338.

The circuit structure shown in FIG. 2 corresponds to the case wherein the number of bits of the address pointer is eight bits, the same as that of the SAM port bit configuration. Therefore, the eight bits of the address pointer can be outputted at a time from the eight serial data output buffers 321 to 328.

However, if the number of bits of the address pointer is greater than that of the SAM port bit configuration, the address pointer cannot be outputted at a time from the serial data output buffers. In such a case, for example, assume that the SAM port bit configuration is four bits, and the address pointer is nine bits. The address pointer is divided into three parts each having three bits. A logical sum of respective three bits is outputted to each of four serial data output buffers.

The circuit structure of such an arrangement is shown in FIG. 3. The serial address pointer line 501 is connected to the input terminals of three-input AND gates 401 to 403 the output terminals of which are connected to the drains of N-channel MOS transistors 411 to 413. Since four serial data output buffers 431 to 434 are used, an N-channel MOS transistor 414 is added. The gates of the transistors 411 to 414 are connected to the test mode select pad 203, and the sources are connected to the serial data output buffers 431 to 434.

The serial data line 500 is connected to the drains of N-channel MOS transistors 421 to 424, the gates of which are connected via an inverter 452 to the test mode select pad 203, and the sources of which are connected to the serial data output buffers 431 to 434. SAM port output pads 441 to 444 are provided at the output side of the serial data output buffers 431 to 434, respectively.

The mode switching operation for this case is as follows. In the normal mode, a low level signal is applied to the test mode select pad 203 to turn the N-channel MOS transistors 411 to 414 off, so that the output from the serial address pointer line 501 is electrically isolated. On the other hand, a high level signal inverted by the inverter is applied to the gates of the N-channel MOS transistors 421 to 424, so that the serial data line 500 is connected to the serial data output buffers 431 to 434. As a result, data in the data register 4 is outputted from the SAM port output pads 441 to 444.

In the test mode, a signal of a power supply potential is applied to the test mode select pad 203, so that the N-channel MOS transistors 411 to 414 turn on. The address pointer of nine bits from the serial address pointer line is applied to the input terminals of the AND gates 401 to 403. A logical sum of respective three bits is supplied via each of the N-channel MOS transistors 411 to 413 to each of the serial data output buffers 431 to 433. The N-channel MOS transistor 414 is supplied with a power supply potential $V_{cc}$ at its drain, so that a high level signal is supplied to the serial data output buffer 434. A low level signal inverted by the inverter 452 is applied to the gates of the N-channel MOS transistors 421 to 424 to turn them off. As a result, the serial data output buffer 434 is disconnected.

In the above manner, the count of the serial counter is externally outputted as logical sums of respective three bits. Therefore, the address pointer can be monitored indirectly.

As described above, the address pointer is outputted to an external circuit during the test mode. Therefore, when data outputted from the SAM port is erroneous, it is possible to easily discriminate between a fault in the data itself and a fault in obtaining the address pointer.

The above-described embodiment has been presented by way of example only, and it is not intended to limit the scope of the present invention. For example, in the embodiment although the address pointer is outputted from the serial data output buffer similar to the data from the data register, an output buffer dedicated to the address pointer may be provided. Furthermore, switching to the test mode may be effected by using a dedicated switching control signal, or by using one of the logical sums of general control signals.

What is claimed is:

1. A semiconductor memory device comprising:
   a RAM port for randomly accessing a memory cell array having memory cells disposed in matrix;
   a SAM port for serially accessing data of one row of said memory cell array;
   mode switching means for switching the operation mode of said SAM port between an ordinary data output mode and a test mode, upon externally receiving a mode switching signal; and
   address pointer outputting means for outputting an address pointer of said SAM port when the operation mode is switched to said test mode by said mode switching means.

2. A semiconductor memory device according to claim 1, wherein said address pointer outputting means includes an output buffer circuit which is the same output buffer circuit for outputting data from said SAM port.

3. A semiconductor memory device according to claim 2, further comprising means for dividing said address pointer into at least two parts and obtaining a logical sum of each part, and means for supplying said logical sum to said address pointer outputting means to output said address pointer, if the bit configuration of said SAM port is smaller than the number of bits of said address pointer.

* * * * *